(12) United States Patent
Ishiwata et al.

(10) Patent No.: US 11,343,451 B2
(45) Date of Patent: May 24, 2022

(54) SOLID-STATE IMAGING DEVICE, METHOD OF DRIVING THE SAME, AND ELECTRONIC APPARATUS

(71) Applicants: Hiroaki Ishiwata, Tokyo (JP); Hideo Kido, Kanagawa (JP); Norihiro Kubo, Kanagawa (JP); Tetsuya Uchida, Kanagawa (JP)

(72) Inventors: Hiroaki Ishiwata, Tokyo (JP); Hideo Kido, Kanagawa (JP); Norihiro Kubo, Kanagawa (JP); Tetsuya Uchida, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/849,843

(22) Filed: Apr. 15, 2020

(65) Prior Publication Data

US 2020/0369371 A1 Nov. 26, 2020

Related U.S. Application Data

(63) Continuation of application No. 15/878,652, filed on Jan. 24, 2018, now Pat. No. 10,659,708, which is a (Continued)

(30) Foreign Application Priority Data

Nov. 6, 2013 (JP) .................................. 2013-230219

(51) Int. Cl.
*H04N 5/369* (2011.01)
*H04N 5/3745* (2011.01)
(Continued)

(52) U.S. Cl.
CPC ..... *H04N 5/36961* (2018.08); *H01L 27/1463* (2013.01); *H01L 27/14603* (2013.01);
(Continued)

(58) Field of Classification Search
CPC ............ H04N 5/37457; H04N 5/3696; H04N 5/3745; H04N 5/37452; H01L 27/14603;
(Continued)

(56) References Cited

U.S. PATENT DOCUMENTS 6,759,641 B1 * 7/2004 Loose ............... H01L 27/14609
250/208.1
7,602,430 B1 * 10/2009 Merrill ................... H04N 5/363
348/241
(Continued)

*Primary Examiner* — Daniel M Pasiewicz
(74) *Attorney, Agent, or Firm* — Sheridan Ross P.C.

(57) ABSTRACT

A solid-state imaging device includes a pixel array unit in which a plurality of imaging pixels configured to generate an image, and a plurality of phase difference detection pixels configured to perform phase difference detection are arranged, each of the plurality of phase difference detection pixels including a plurality of photoelectric conversion units, a plurality of floating diffusions configured to convert charges stored in the plurality of photoelectric conversion units into voltage, and a plurality of amplification transistors configured to amplify the converted voltage in the plurality of floating diffusions.

20 Claims, 14 Drawing Sheets

Related U.S. Application Data continuation of application No. 15/582,218, filed on Apr. 28, 2017, now Pat. No. 9,924,119, which is a continuation of application No. 14/528,753, filed on Oct. 30, 2014, now Pat. No. 9,641,780.

(51) Int. Cl.
   *H01L 27/146* (2006.01)
   *H04N 5/347* (2011.01)

(52) U.S. Cl.
   CPC .. *H01L 27/14609* (2013.01); *H01L 27/14641* (2013.01); *H01L 27/14643* (2013.01); *H04N 5/347* (2013.01); *H04N 5/37452* (2013.01); *H04N 5/37457* (2013.01)

(58) Field of Classification Search
   CPC ........... H01L 27/14609; H01L 27/1463; H01L 27/14641
   See application file for complete search history.

(56) References Cited

U.S. PATENT DOCUMENTS

| | | | |
|---|---|---|---|
| 9,641,780 B2 * | 5/2017 | Ishiwata | H04N 5/37457 |
| 9,924,119 B2 * | 3/2018 | Ishiwata | H01L 27/14641 |
| 10,659,708 B2 * | 5/2020 | Ishiwata | H04N 5/37457 |
| 2003/0125636 A1 | 7/2003 | Jeong et al. | |
| 2008/0136578 A1 | 6/2008 | Kruska et al. | |
| 2013/0021441 A1 * | 1/2013 | Kim | H01L 27/14641 348/46 |
| 2014/0145068 A1 * | 5/2014 | Meynants | H04N 5/3696 250/208.1 |
| 2015/0124139 A1 * | 5/2015 | Ishiwata | H04N 5/3696 348/308 |

* cited by examiner

SOLID-STATE IMAGING DEVICE, METHOD OF DRIVING THE SAME, AND ELECTRONIC APPARATUS

CROSS REFERENCE TO RELATED APPLICATIONS

This application is a continuation of U.S. patent application Ser. No. 15/878,652 filed Jan. 24, 2018 which is a continuation of U.S. patent application Ser. No. 15/582,218 filed Apr. 28, 2017 now U.S. Pat. No. 9,924,119, which is a continuation of U.S. patent application Ser. No. 14/528,753, filed Oct. 30, 2014, now U.S. Pat. No. 9,641,780, which claims the benefit of Japanese Priority Patent Application JP 2013-230219 filed Nov. 6, 2013, the entire contents of which are incorporated herein by reference.

BACKGROUND

The present disclosure relates to a solid-state imaging device, a method of driving the solid-state imaging device, and an electronic apparatus, and particularly to a solid-state imaging device, a method of driving the solid-state imaging device, and an electronic apparatus that can improve autofocusing (AF) speed and accuracy.

A solid-state imaging device that performs AF with so-called a phase difference detection method in which an imaging pixel and a phase difference detection pixel are provided in a pixel array unit and AF is performed based on the amount of displacement between signals output from a pair of phase difference detection pixels has been known.

In some of these solid-state imaging devices, the number of phase difference detection pixels is increased and the AF accuracy is improved by providing two photoelectric conversion units in a pixel (see, for example, Japanese Patent Application Laid-open No. 2012-165070 and Japanese Patent Application Laid-open No. 2007-243744).

SUMMARY

In the phase difference detection pixel disclosed in Japanese Patent Application Laid-open No. 2012-165070, however, because the two photoelectric conversion units share one amplification transistor, it may be impossible to expose and read from the two photoelectric conversion units simultaneously, which makes AF tracking capabilities with respect to a fast-moving subject insufficient.

On the other hand, in the phase difference detection pixel disclosed in Japanese Patent Application Laid-open No. 2007-243744, by providing a charge storage unit configured to store charges for each photoelectric conversion unit, it is possible to expose and read from the two photoelectric conversion units simultaneously.

However, by providing a charge storage unit, the area of the photoelectric conversion unit decreases. As a result, the sensitivity of the phase difference detection pixel and the AF accuracy are reduced.

The present disclosure had been made in view of the above circumstances, and it is desirable to improve the AF speed and accuracy.

According to an embodiment of the present disclosure, there is provided a solid-state imaging device, including a pixel array unit in which a plurality of imaging pixels configured to generate an image, and a plurality of phase difference detection pixels configured to perform phase difference detection are arranged, each of the plurality of phase difference detection pixels including a plurality of photoelectric conversion units, a plurality of floating diffusions configured to convert charges stored in the plurality of photoelectric conversion units into voltage, and a plurality of amplification transistors configured to amplify the converted voltage in the plurality of floating diffusions.

In each of the plurality of phase difference detection pixels, at least one of the plurality of photoelectric conversion units may share the floating diffusion and the amplification transistor with at least one of the plurality of imaging pixels, which is adjacent to the phase difference detection pixel.

The phase difference detection pixel may include a first photoelectric conversion unit and a second photoelectric conversion unit, the first photoelectric conversion unit may share the floating diffusion and the amplification transistor with a first imaging pixel adjacent to the phase difference detection pixel, and the second photoelectric conversion unit may share the floating diffusion and the amplification transistor with a second imaging pixel that is different from the first imaging pixel and is adjacent to the phase difference detection pixel.

The phase difference detection pixel and the first imaging pixel may be included in one pixel sharing unit, and the second imaging pixel may be included in another pixel sharing unit.

According to an embodiment of the present disclosure, there is provided a method for driving a solid-state imaging device that includes a pixel array unit in which a plurality of imaging pixels configured to generate an image, and a plurality of phase difference detection pixels configured to perform phase difference detection are arranged, each of the plurality of phase difference detection pixels including a plurality of photoelectric conversion units, a plurality of floating diffusions configured to convert charges stored in the plurality of photoelectric conversion units into voltage, and a plurality of amplification transistors configured to amplify the converted voltage in the plurality of floating diffusions, the method including storing charges in the plurality of photoelectric conversion units, and reading signals corresponding to the charges stored in the plurality of photoelectric conversion units, by the solid-state imaging device, in the phase difference detection pixel.

According to an embodiment of the present disclosure, there is provided an electronic apparatus, including a solid-state imaging device that includes a pixel array unit in which a plurality of imaging pixels configured to generate an image, and a plurality of phase difference detection pixels configured to perform phase difference detection are arranged, each of the plurality of phase difference detection pixels including a plurality of photoelectric conversion units, a plurality of floating diffusions configured to convert charges stored in the plurality of photoelectric conversion units into voltage, and a plurality of amplification transistors configured to amplify the converted voltage in the plurality of floating diffusions.

According to an embodiment of the present disclosure, a plurality of FDs convert charges stored in the photoelectric conversion units into voltage in the phase difference detection pixel, and a plurality of amplification transistors amplify the voltage of the FDs.

According to an embodiment of the present disclosure, it is possible to improve the AF speed and accuracy.

These and other objects, features and advantages of the present disclosure will become more apparent in light of the

DETAILED DESCRIPTION OF EMBODIMENTS

Hereinafter, embodiments of the present disclosure will be described with reference to the drawings.

(Functional Configuration Example of Electronic Apparatus)

Figure 1:
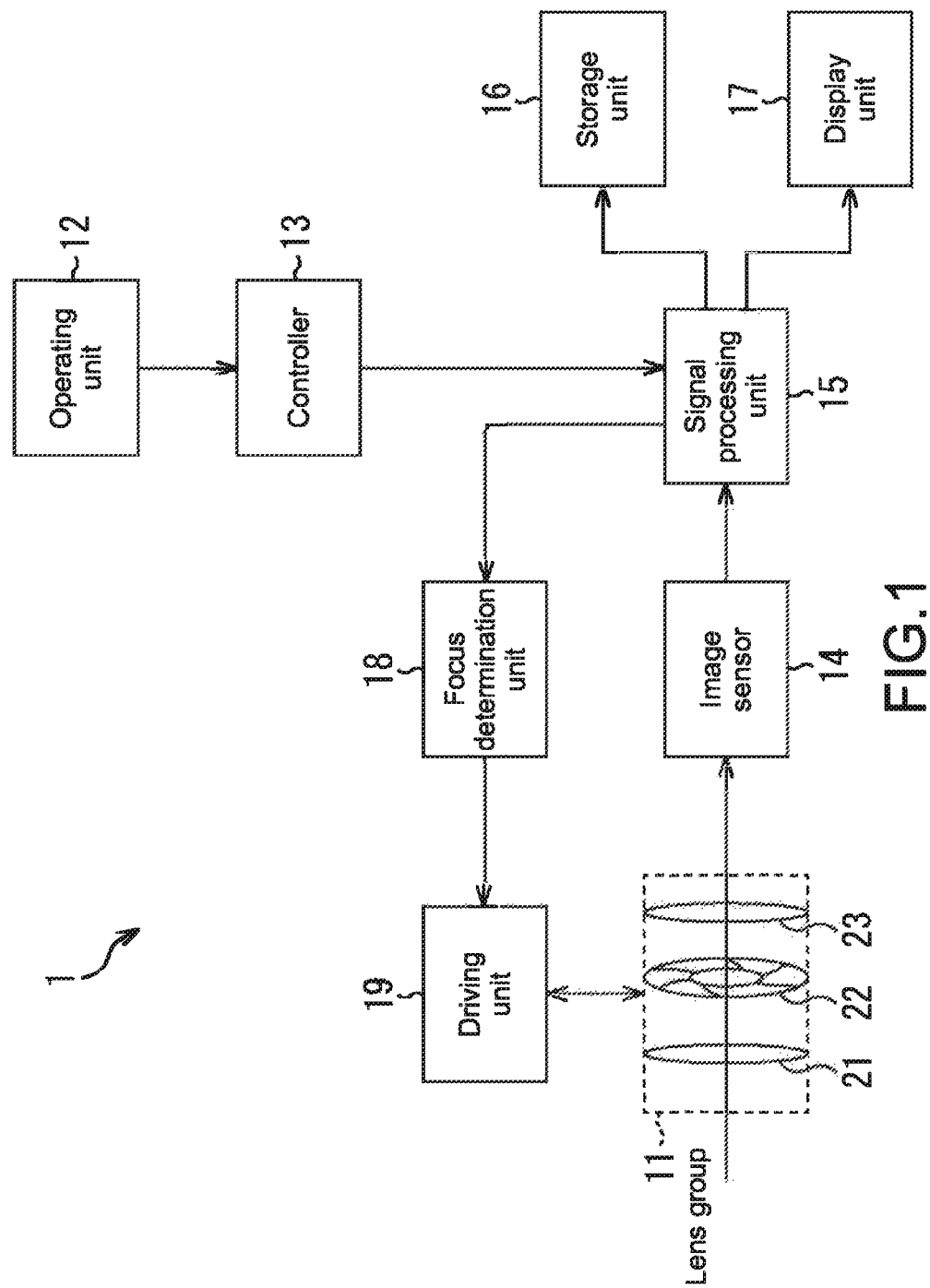
FIG. 1 is a block diagram showing a configuration example of an electronic apparatus including a solid-state imaging device to which an embodiment of the present disclosure is applied.

FIG. 1 is a block diagram showing a configuration example of an electronic apparatus including a solid-state imaging device to which an embodiment of the present disclosure is applied.

An electronic apparatus 1 is configured as a digital camera, a portable terminal having imaging capabilities, or the like, and is configured to capture an image of an object with an autofocusing (AF) function to generate a captured image, and store the image as a still image or moving image. Hereinafter, the assumption is made that mainly a still image is recorded.

The electronic apparatus 1 includes a lens unit 11, an operating unit 12, a controller 13, an image sensor 14, a signal processing unit 15, a storage unit 16, a display unit 17, a focus determination unit 18, and a driving unit 19.

The lens unit 11 is configured to collect light from an object (object light). The object light collected by the lens unit 11 enters the image sensor 14.

The lens unit 11 includes a zoom lens 21, a diaphragm 22, and a focus lens 23.

The zoom lens 21 is configured to move in an optical axis direction by driving of the driving unit 19, thereby changing the focal length to adjust the magnification of an object in a captured image. The diaphragm 22 is configured to change the degree of opening by driving of the driving unit 19, thereby adjusting the amount of object light to be incident on the image sensor 14. The focus lens 23 is configured to move in an optical axis direction by driving of the driving unit 19, thereby adjusting the focus.

The operating unit 12 is configured to receive a user's operation. The operating unit 12 supplies an operation signal to the controller 13 in the case where a shutter button (not shown) is pressed, for example. The operation signal indicates that a shutter button is pressed.

The controller 13 is configured to control the operation of respective units of the electronic apparatus 1.

For example, in the case where the controller 13 receives an operation signal indicating that a shutter button is pressed, the controller 13 supplies an instruction of recording a still image to the signal processing unit 15. In addition, the controller 13 supplies an instruction of generating a live view image to the signal processing unit 15 to display the live view image on the display unit 17. The live view image is a real-time image of an object.

In addition, the controller 13 supplies an instruction of performing focus determining operation (phase difference detection operation) to the signal processing unit 15 to determine focus with use of a phase difference detection method. The phase difference detection method is a focus detection method in which light transmitted through an imaging lens is pupil-divided to form a pair of images, and the degree of focus is detected by measuring (detecting phase difference) the interval between the formed images (amount of displacement between images).

The image sensor 14 is a solid-state imaging device configured to photoelectrically convert received object light into an electric signal.

For example, the image sensor 14 is realized by a complementary metal oxide semiconductor (CMOS) image sensor, a charge coupled device (CCD) image sensor, or the like. In the case where the image sensor 14 is a CMOS image sensor, the image sensor 14 may be front-surface irradiation type image sensor or rear-surface irradiation type image sensor. In addition, in the case where the image sensor 14 is a rear-surface irradiation type CMOS image sensor, the image sensor 14 may be configured as a lamination type CMOS image sensor in which a semiconductor substrate including a pixel array unit and a semiconductor substrate including a logic circuit are bonded together.

The image sensor 14 includes a pixel array unit in which a plurality of pixels (imaging pixels) configured to generate a signal for generating a captured image based on received object light, and a plurality of pixels (phase difference detection pixels) configured to generate a signal for performing phase difference detection are arranged. The image sensor 14 supplies an electric signal generated by photoelectric conversion to the signal processing unit 15.

The signal processing unit 15 performs various types of signal processing on the electric signal supplied from the image sensor 14.

For example, in the case where an instruction of recording a still image is supplied from the controller 13, the signal processing unit 15 generates data of a still image (still image data) and supplies the generated data to the storage unit 16. In addition, in the case where an instruction of generating a live view image is supplied from the controller 13, the signal processing unit 15 generates data of a live view image (live view image data) based on a signal output from an imaging pixel in the image sensor 14, and supplies the generated data to the display unit 17.

In addition, in the case where an instruction of performing phase difference detection operation is supplied from the controller 13, the signal processing unit 15 generates data for detecting phase difference (phase difference detection data) based on a signal output from a phase difference detection pixel in the image sensor 14, and supplies the generated data to the focus determination unit 18.

The storage unit 16 is configured to store the image data supplied from the signal processing unit 15. The storage unit 16 is configured as a disk such as a digital versatile disk (DVD), a semiconductor memory such as a memory card, or one or more removable storage media, for example. These storage media may be built in the electronic apparatus 1, or may be allowed to be mounted on and removed from the electronic apparatus 1.

The display unit 17 is configured to display an image based on the image data supplied from the signal processing unit 15. For example, in the case where the live view image data is supplied from the signal processing unit 15, the display unit 17 displays a live view image. The display unit 17 is realized by a liquid crystal display (LCD), an electroluminescence (EL) display, or the like.

The focus determination unit 18 is configured to determine whether or not an object being a focusing target (focusing target object) is focused based on the phase difference detection data supplied from the signal processing unit 15. In the case where an object in a focus area is focused, the focus determination unit 18 supplies, to the driving unit 19, information representing that the object is focused as a focus determination result. In addition, in the case where the focus target object is not focused, the focus determination unit 18 calculates the amount of displacement of focus (defocus amount), and supplies, to the driving unit 19, information representing the calculated defocus amount as a focus determination result.

The driving unit 19 is configured to drive the zoom lens 21, the diaphragm 22, and the focus lens 23. For example, the driving unit 19 calculates the amount of driving of the focus lens 23 based on the focus determination result supplied from the focus determination unit 18, and moves the focus lens 23 depending on the calculated driving amount.

Specifically, in the case where an object is focused, the driving unit 19 causes the focus lens 23 to maintain the current position. In addition, in the case where an object is not focused, the driving unit 19 calculates the driving amount (moving distance) based on the focus determination result representing the defocus amount and the position of the focus lens 23, and moves the focus lens 23 depending on the driving amount.

(Regarding Pixel Arrangement of Pixel Array Unit)

Next, the pixel arrangement of the pixel array unit of the image sensor 14 will be described with reference to FIG. 2.

Figure 2:
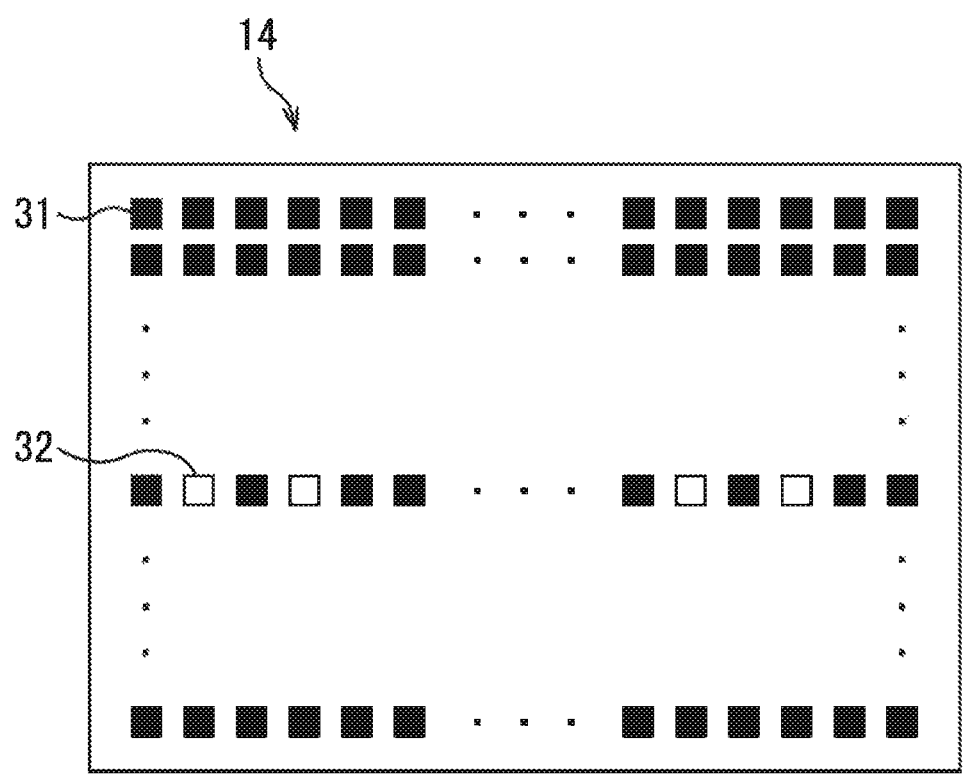
FIG. 2 is a diagram for explaining pixel arrangement.

As shown in FIG. 2, in the pixel array unit of the image sensor 14, a plurality of imaging pixels 31 represented by black squares are two-dimensionally arranged in a matrix pattern. The imaging pixel 31 includes an R pixel, G pixel, and B pixel. These pixels are regularly arranged in a Bayer pattern.

Moreover, in the pixel array unit of the image sensor 14, a plurality of phase difference detection pixels 32 represented by white squares are arranged in a scattered pattern among the plurality of imaging pixels 31 two-dimensionally arranged in a matrix pattern. Specifically, the phase difference detection pixels 32 are regularly arranged in a specific pattern by replacing a part of the imaging pixels 31 in the pixel array unit of the image sensor 14. It should be noted that the arrangement of the imaging pixels 31 and the phase difference detection pixels 32 in the image sensor 14 is not limited to the above, and the pixels may be arranged in another pattern.

(Detailed Configuration Example of Pixel)

Figure 3:
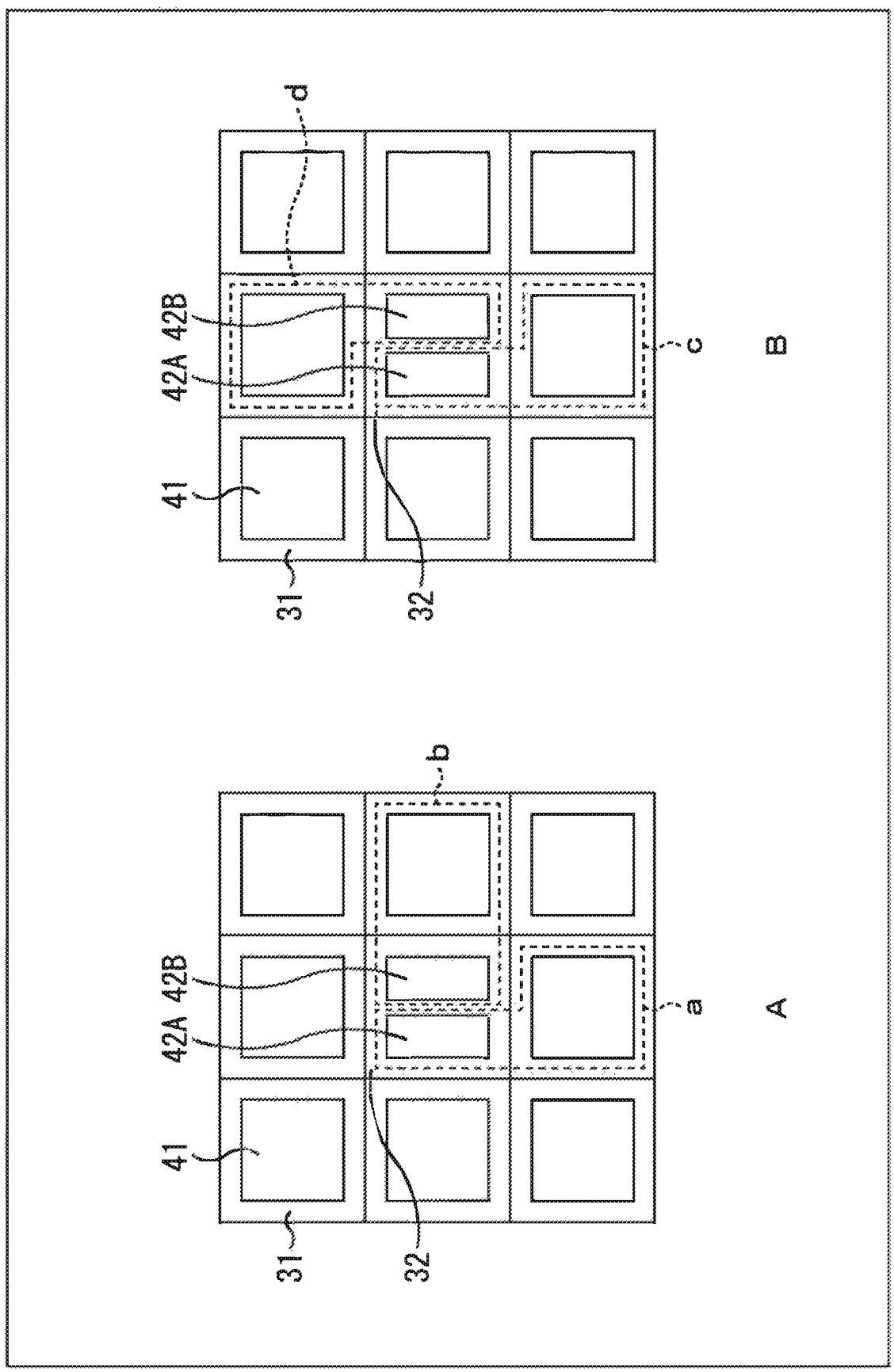
FIG. 3 is a diagram for explaining sharing of a floating diffusion (FD) and an amplification transistor.

FIG. 3 shows a detailed configuration example of the imaging pixel 31 and the phase difference detection pixel 32 arranged in the pixel array unit.

As shown in FIGS. 3A and 3B, the imaging pixel 31 includes a photoelectric conversion unit (photodiode) 41. In the imaging pixel 31, a signal for generating a captured image is generated based on charges generated by photoelectric conversion of received object light performed by the photoelectric conversion unit 41.

Moreover, although not shown, the imaging pixel 31 at least includes a transfer transistor that transfers charges stored in the photoelectric conversion unit 41, a floating diffusion (FD) that stores the charges transferred from the photoelectric conversion unit 41 and converts the stored charges into voltage, a reset transistor that discharges (resets) charges stored in the FD, and an amplification transistor that amplifies the voltage of the FD and outputs the amplified voltage to a vertical signal line. It should be noted that a selection transistor may be provide between the amplification transistor and the vertical signal line. The selection transistor switches on and off of the output of the voltage of the amplification transistor to the vertical signal line.

On the other hand, the phase difference detection pixel 32 includes two photoelectric conversion units 42A and 42B. In the phase difference detection pixel 32, a signal for performing phase difference detection is generated based on charges generated by photoelectric conversion of received object light performed by the photoelectric conversion units 42A and 42B.

Moreover, although not shown, the phase difference detection pixel 32 includes two transfer transistors, two FDs, two reset transistors, and two amplification transistors corresponding to the photoelectric conversion units 42A and 42B.

Specifically, the photoelectric conversion units 42A and 42B share the FD, the reset transistor, and the amplification transistor with the photoelectric conversion unit 41 of the imaging pixel 31 adjacent to the phase difference detection pixel 32.

For example, as shown by broken lines a in FIG. 3A, the photoelectric conversion unit 42A can share the FD, the reset transistor, and the amplification transistor with the photoelectric conversion unit 41 the imaging pixel 31 adjacent to the phase difference detection pixel 32 on the lower side. On the other hand, as shown by broken lines b in FIG. 3A, the photoelectric conversion unit 42B can share the FD, the reset transistor, and the amplification transistor with the photoelectric conversion unit 41 of the imaging pixel 31 adjacent to the phase difference detection pixel 32 on the right side.

Moreover, as shown by broken lines c in FIG. 3B, the photoelectric conversion unit 42A can share the FD, the reset transistor, and the amplification transistor with the photoelectric conversion unit 41 of the imaging pixel 31 adjacent to the phase difference detection pixel 32 on the lower side. On the other hand, as shown by broken lines d in FIG. 3B, the photoelectric conversion unit 42B can share the FD, the reset transistor, and the amplification transistor with the photoelectric conversion unit 41 of the imaging pixel 31 adjacent to the phase difference detection pixel 32 on the upper side.

As described above, because the two photoelectric conversion units 42A and 42B share the FD and the amplification transistor with different adjacent pixels in the phase difference detection pixel 32, the image sensor 14 can perform exposure (storing charges) of the two photoelectric conversion units 42A and 42B, and read a signal corresponding to the stored charges simultaneously.

Now, an embodiment in which the photoelectric conversion units 42A and 42B share the FD, the reset transistor, and the amplification transistor with the photoelectric conversion unit 41 of the adjacent imaging pixel 31 will be described.

(Configuration Example of First Embodiment)

Figure 4:
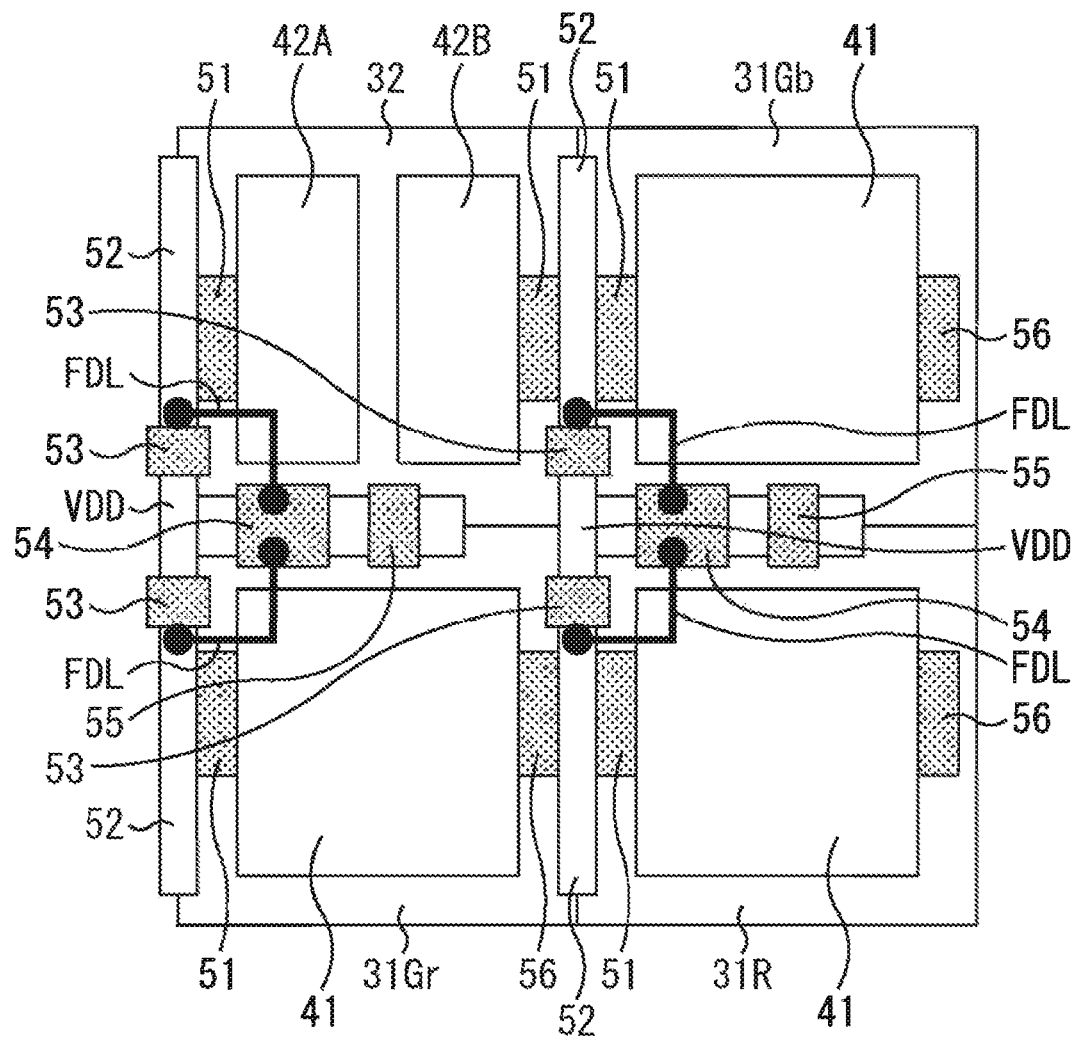
FIG. 4 is a plan view showing a configuration example of a pixel according to a first embodiment of the present disclosure.

First, a configuration example of an imaging pixel and a phase difference detection pixel according to a first embodiment of the present disclosure will be described with reference to FIGS. 4 and 5. FIG. 4 is a plan view showing a configuration example of the imaging pixel and the phase difference detection pixel, and FIG. 5 is a circuit diagram showing a configuration example of the imaging pixel and the phase difference detection pixel.

Figure 5:
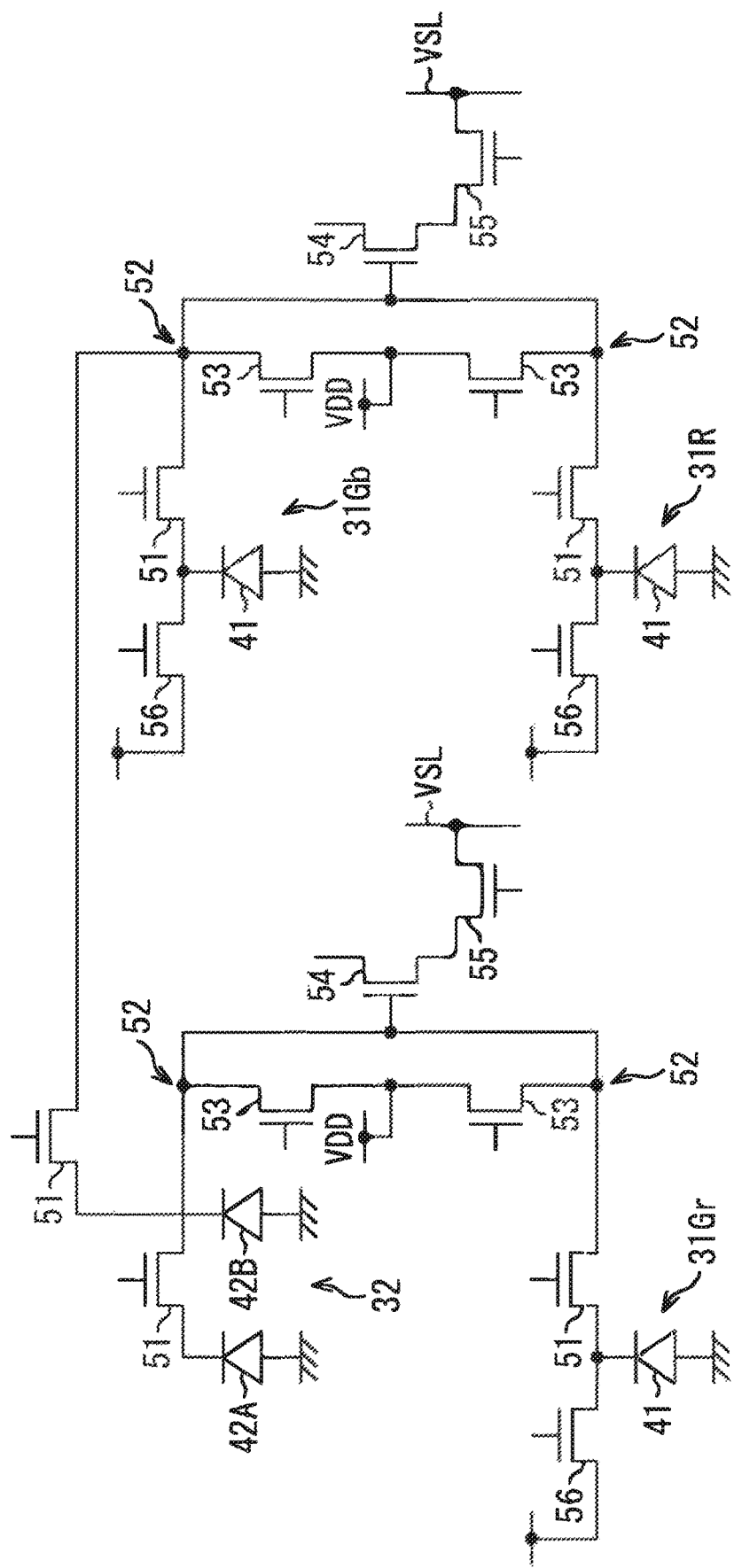
FIG. 5 is a circuit diagram showing a configuration example of the pixel according to the first embodiment of the present disclosure.

In FIGS. 4 and 5, three imaging pixels 31Gr, 31Gb, and 31R, and the phase difference detection pixel 32 are shown.

In this example, the phase difference detection pixel 32 and the imaging pixel 31Gr form the configuration in which two vertical pixels are shared, and the imaging pixel 31Gb and the imaging pixel 31R form the configuration in which two vertical pixels are shared.

Each of the imaging pixels 31Gr, 31Gb, and 31R includes the photoelectric conversion unit 41, a transfer transistor 51, an FD 52, a reset transistor 53, an amplification transistor 54, a selection transistor 55, and an overflow control transistor 56 that discharges charges stored in the photoelectric conversion unit 41.

By providing the overflow control transistor 56 in the imaging pixels 31Gr, 31Gb, and 31R, it is possible to maintain the optical symmetry between pixels and to reduce the difference of the imaging properties. Furthermore, by switching on the overflow control transistor 56, it is possible to suppress the blooming of adjacent pixel.

Moreover, the phase difference detection pixel 32 includes the photoelectric conversion units 42A and 42B, the transfer transistor 51, the FD 52, the reset transistor 53, the amplification transistor 54, and the selection transistor 55 corresponding to the photoelectric conversion units 42A and 42B.

It should be noted that the FD 52 corresponding to the photoelectric conversion unit 42B is shared with the photoelectric conversion unit 41 of the imaging pixel 31Gb.

Furthermore, as shown in FIG. 4, the FD 52 corresponding to the photoelectric conversion unit 42A in the phase difference detection pixel 32 and the FD 52 of the imaging pixel 31Gr are connected to gate electrodes of the amplification transistor 54 with respective wirings FDL. Accordingly, the photoelectric conversion unit 42A can share the FD 52, the amplification transistor 54, and the selection transistor 55 with the photoelectric conversion unit 41 of the imaging pixel 31Gr.

Moreover, the FD 52 corresponding to the photoelectric conversion unit 42B in the phase difference detection pixel 32 (i.e., the FD 52 of the imaging pixel 31Gb) and the FD 52 of the imaging pixel 31R are connected to gate electrodes of the amplification transistor 54 with respective wirings FDL. Accordingly, the photoelectric conversion unit 42B can share the FD 52, the amplification transistor 54, and the selection transistor 55 with the photoelectric conversion unit 41 of the imaging pixels 31Gb and 31R.

According to the above configuration, because two photoelectric conversion units share an FD and an amplification transistor of different adjacent pixels in a phase difference detection pixel, it is possible to simultaneously expose and read from the two photoelectric conversion units without providing a charge storage unit and to improve AF speed and accuracy.

(Another Configuration Example of First Embodiment)

Figure 6:
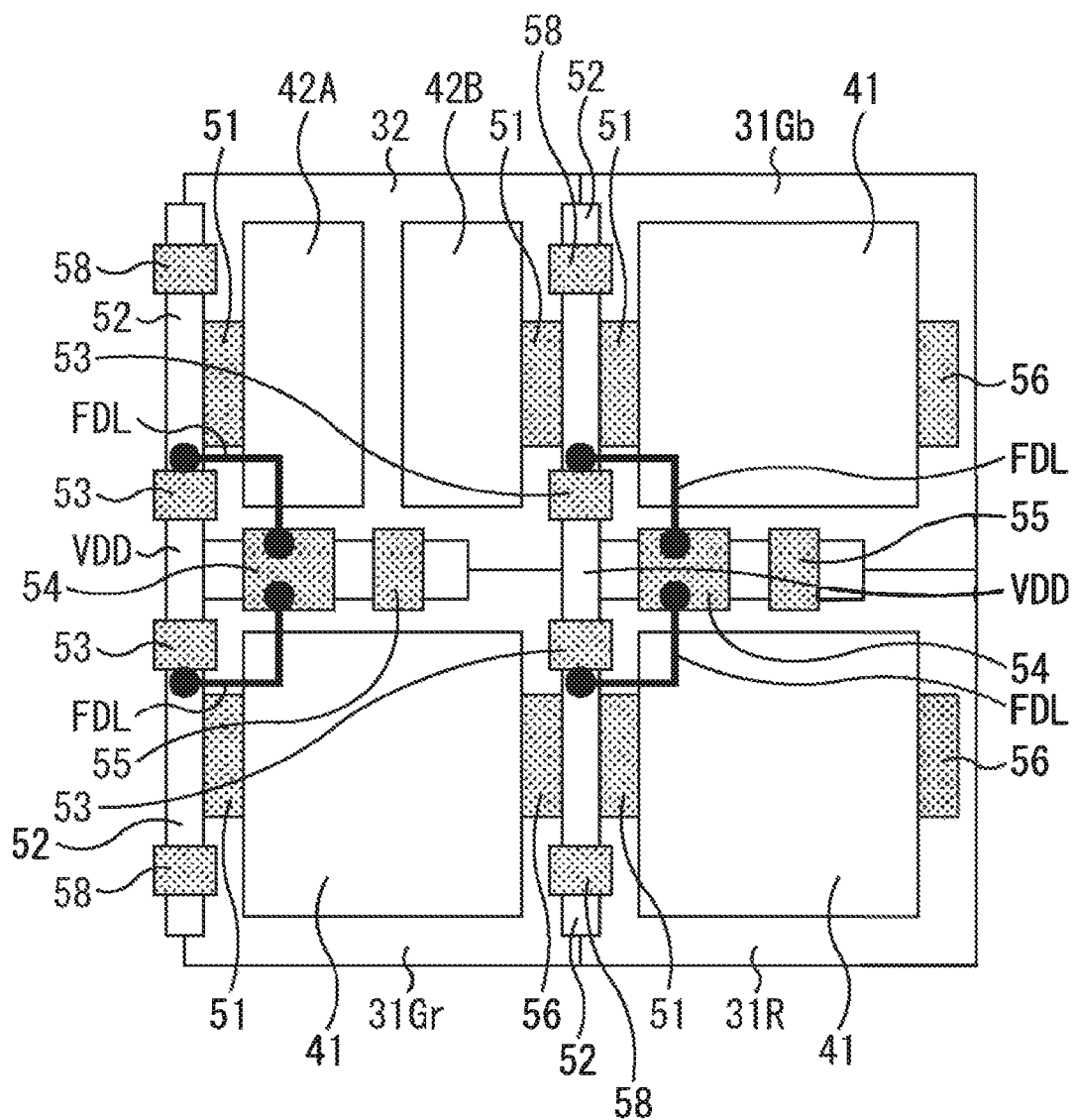
FIG. 6 is a plan view showing another configuration example of the pixel according to the first embodiment of the present disclosure.

Next, another configuration example of an imaging pixel and a phase difference detection pixel according to the first embodiment of the present disclosure will be described with reference to FIGS. 6 and 7. FIG. 6 is a plan view showing a configuration example of the image pixel and the phase difference detection pixel, and FIG. 7 is a circuit diagram showing a configuration example of the imaging pixel and the phase difference detection pixel.

Figure 7:
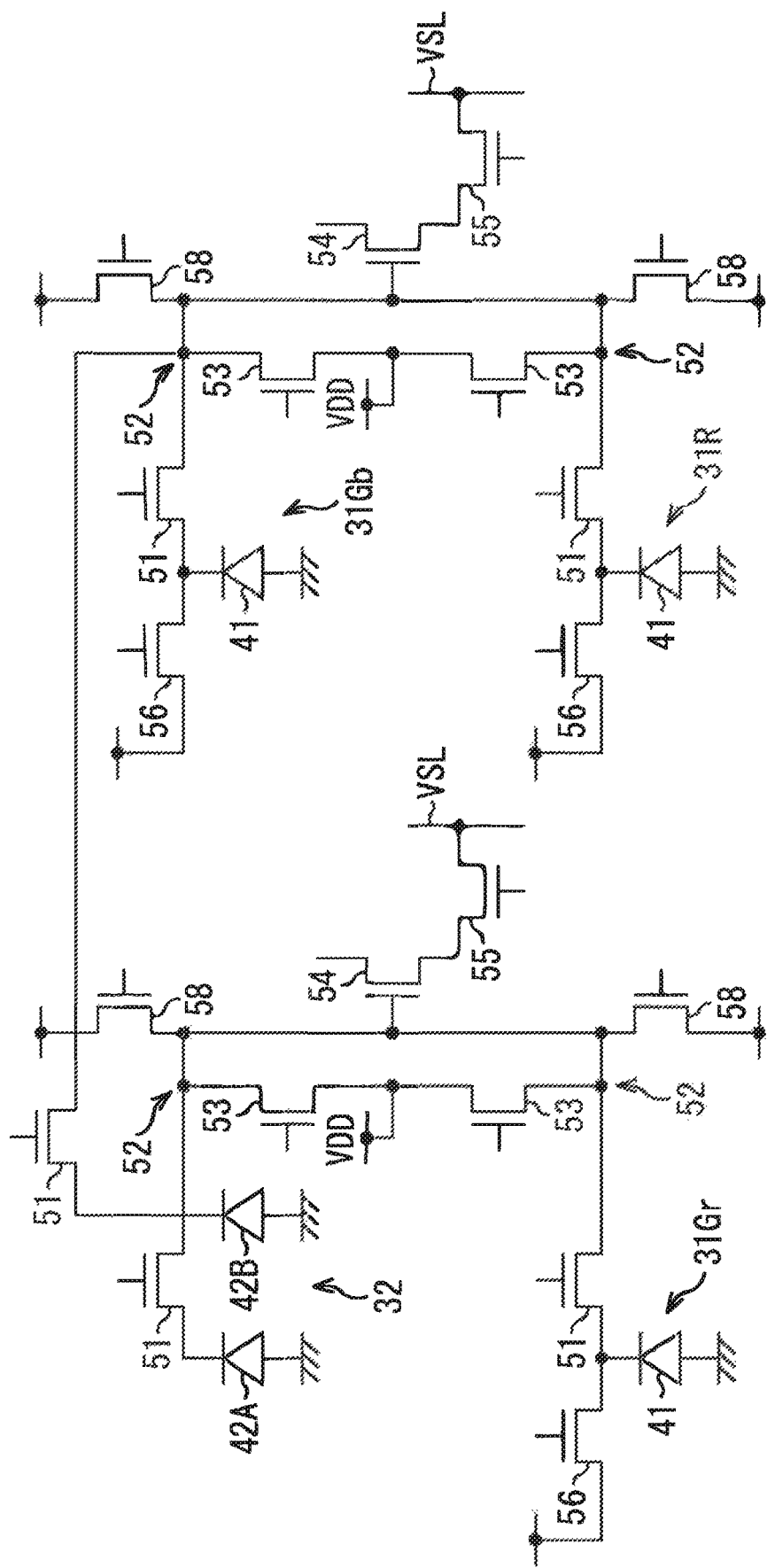
FIG. 7 is a circuit diagram showing another configuration example of the pixel according to the first embodiment of the present disclosure.

It should be noted that between the imaging pixel 31Gb, 31Gr, and 31R and the phase difference detection pixel 32 shown in FIGS. 6 and 7, and the imaging pixel 31Gb, 31Gr, and 31R and the phase difference detection pixel 32 shown in FIGS. 4 and 5, a description of components formed in the same way will be omitted.

The imaging pixel 31Gr, 31Gb, and 31R and the phase difference detection pixel 32 shown in FIGS. 6 and 7 include two conversion efficiency switching transistors 58 for each pixel sharing unit in addition to the components shown in FIGS. 4 and 5. Specifically, the imaging pixel 31Gr, 31Gb, and 31R and the FDs 52 in the phase difference detection pixel 32 are connected to respective conversion efficiency switching transistors 58.

In the pixel sharing unit (e.g., two pixels of the phase difference detection pixel 32 and the imaging pixel 31Gr), when any one of the two conversion efficiency switching transistors 58 is turned on, the one conversion efficiency switching transistor 58 is electrically connected to the FD 52. As a result, a floating diffusion area of the FD 52 is enlarged, the capacity of the FD 52 increases, and the conversion efficiency is reduced. Moreover, when the two conversion efficiency switching transistors 58 are turned on, the floating diffusion area of the FD 52 is further enlarged, and the conversion efficiency is further reduced.

As described above, because the conversion efficiency of the FD 52 can be switched by turning on and off of the conversion efficiency switching transistor 58, it is possible to improve the signal to noise (S/N) ratio by turning off of the two conversion efficiency switching transistors 58 and increasing the conversion efficiency under low illumination, and the FD 52 can receive the saturation amount of signals from the photoelectric conversion unit 41 (42A and 42B) by turning on the conversion efficiency switching transistor 58 under high illumination.

(Configuration Example of Second Embodiment)

Figure 8:
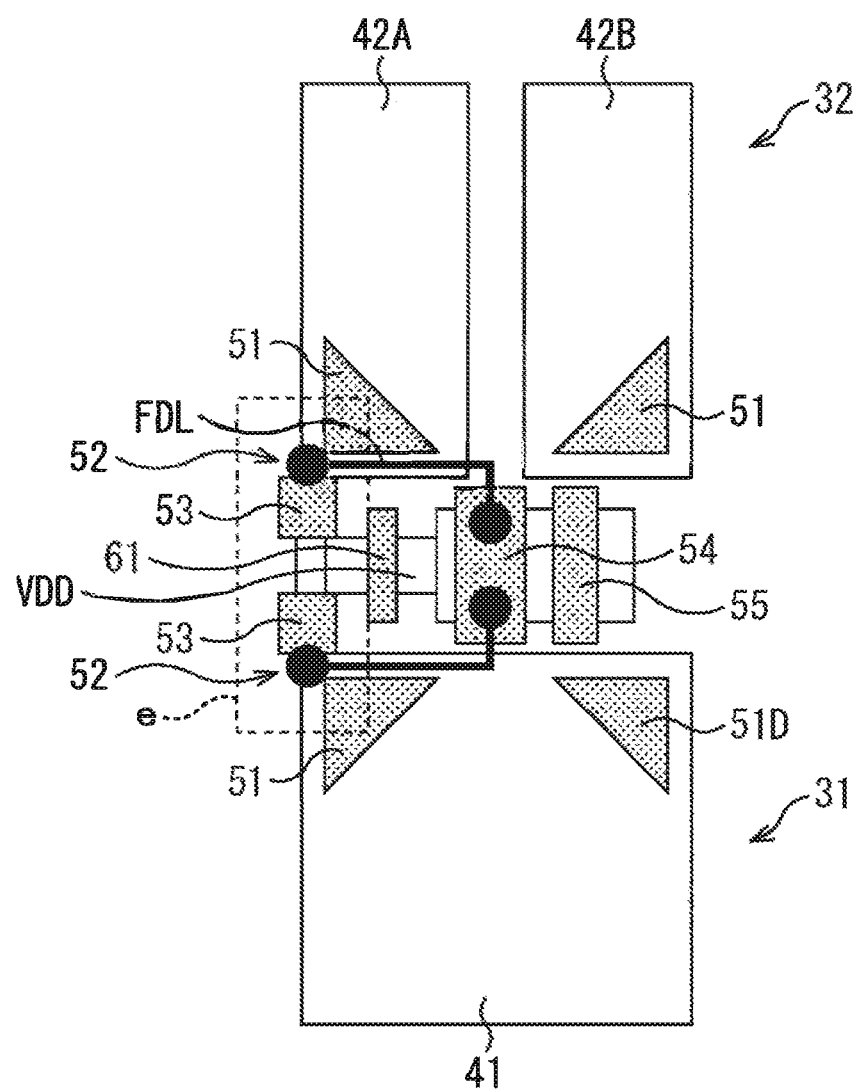
FIG. 8 is a plan view showing a configuration example of a pixel according to a second embodiment of the present disclosure.

Next, a configuration example of an imaging pixel and a phase difference pixel according to a second embodiment of the present disclosure will be described with reference to FIGS. 8 and 9. FIG. 8 is a plan view showing a configuration example of the imaging pixel and the phase difference pixel, and FIG. 9 is a circuit diagram showing a configuration example of the imaging pixel and the phase difference pixel.

Figure 9:
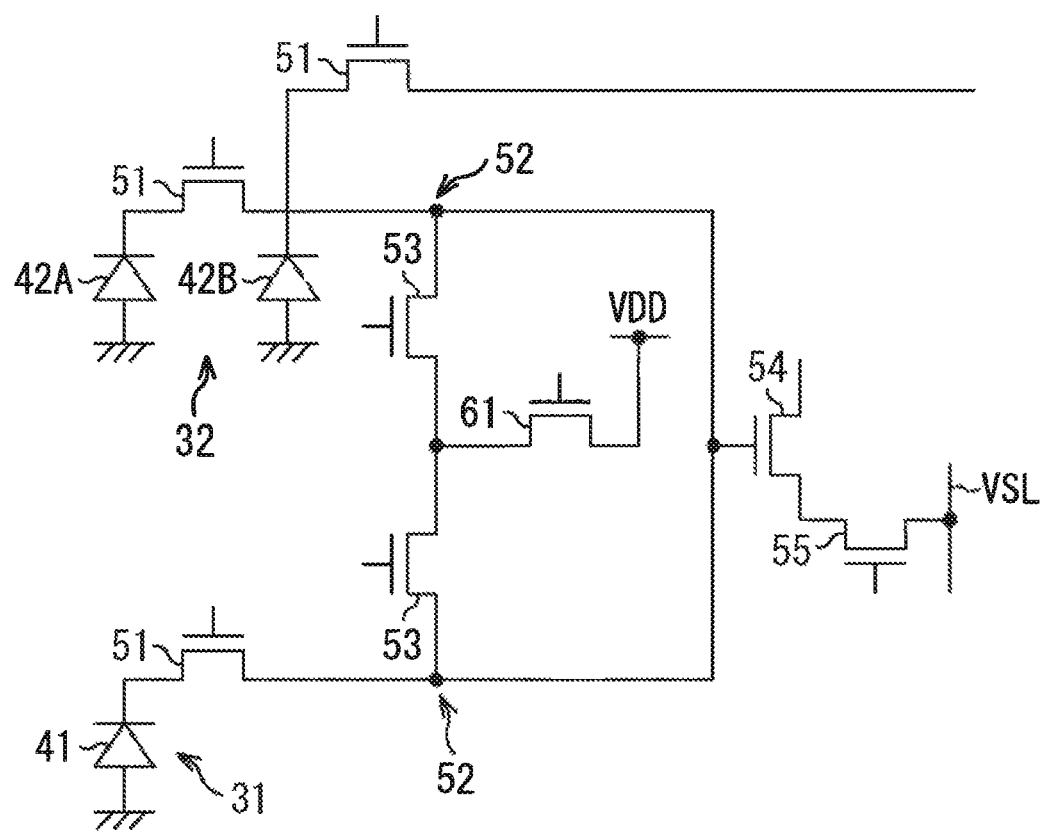
FIG. 9 is a circuit diagram showing a configuration example of the pixel according to the second embodiment of the present disclosure.

In FIGS. 8 and 9, one imaging pixel 31 and one phase difference detection pixel 32 are shown.

In this example, the phase difference detection pixel 32 and the imaging pixel 31 form the configuration in which two vertical pixels are shared.

The imaging pixel 31 includes the photoelectric conversion unit 41, the transfer transistor 51, a transfer transistor 51D, the FD 52, the reset transistor 53, the amplification transistor 54, and the selection transistor 55. It should be noted that the transfer transistor 51D is provided to maintain the symmetry of the pixel structure, and does not have a function such as transferring charges of the photoelectric conversion unit 41 unlike the transfer transistor 51. It should be noted that in the imaging pixel 31, an overflow control transistor that discharges charges stored in the photoelectric conversion unit 41 may be provided.

Moreover, the phase difference detection pixel 32 includes the photoelectric conversion units 42A and 42B, the transfer transistor 51, the FD 52, the reset transistor 53, the amplification transistor 54, and the selection transistor 55 corresponding to the photoelectric conversion units 42A and 42B.

It should be noted that the FD corresponding to the photoelectric conversion unit 42B is shared with a photoelectric conversion unit of an imaging pixel (not shown) adjacent to the phase difference detection pixel 32.

Furthermore, as shown in FIG. 8, the FD 52 corresponding to the photoelectric conversion unit 42A in the phase difference detection pixel 32 and the FD 52 of the imaging pixel 31 are connected to gate electrodes of the amplification transistor 54 with respective wirings FDL. Accordingly, the photoelectric conversion unit 42A can share the FD 52, the amplification transistor 54, and the selection transistor 55 with the photoelectric conversion unit 41 of the imaging pixel 31.

Moreover, the FD 52 corresponding to the photoelectric conversion unit 42B in the phase difference detection pixel 32 and an FD of the imaging pixel (not shown) are connected to gate electrodes an amplification transistor of the imaging pixel (not shown) with respective wirings FDL (not shown). Accordingly, the photoelectric conversion unit 42B can share the FD, the amplification transistor, and the selection transistor with the photoelectric conversion unit of the imaging pixel (not shown).

According to the above configuration, because two photoelectric conversion units share an FD and an amplification transistor of different adjacent pixels in the phase difference detection pixel, it is possible to simultaneously expose and read from the two photoelectric conversion units without providing a charge storage unit and to improve AF speed and accuracy.

Figure 10:
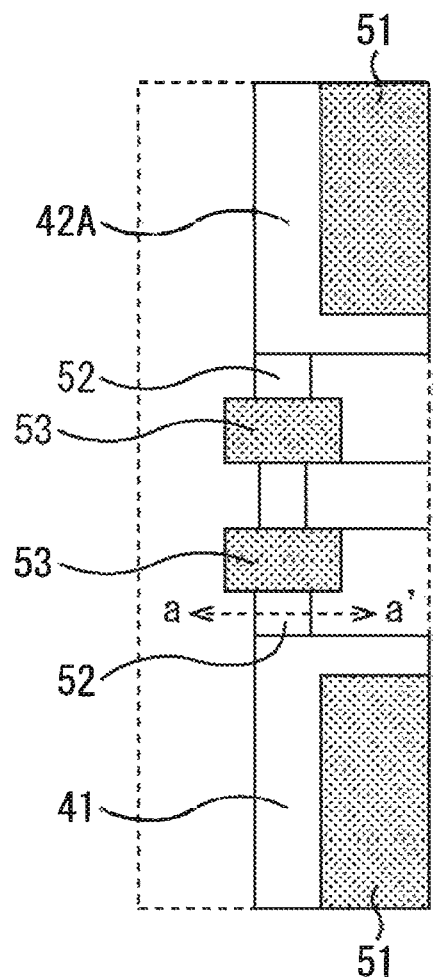
FIG. 10 is a flowchart for explaining the configuration of the FD.

It should be noted that in this example, between pixels forming the pixel sharing unit (the imaging pixel 31 and the phase difference detection pixel 32), a pixel transistor including the amplification transistor 54 is arranged. With such a configuration, as shown in FIG. 10, which is an enlarged view of a part surrounded by broken lines e in FIG. 8, because the FD 52 of the respective pixels and the amplification transistor 54 are arranged to be adjacent to each other, it is possible to design the length of the wiring FDL for connecting the FD 52 and the amplification transistor 54 to be short and to increase the conversion efficiency.

Furthermore, in this example, the source of the respective reset transistors 53 of the imaging pixel 31 and the phase difference detection pixel 32 is connected to the FD 52 of the respective pixels. Accordingly, it is possible to reduce the capacity of the FD 52 and to increase the conversion efficiency.

Furthermore, in this example, the drain of the respective reset transistors 53 of the imaging pixel 31 and the phase difference detection pixel 32 is connected to a source of a conversion efficiency switching transistor 61. With such a configuration, it is possible to change the capacity of the FD 52 by turning on and off of the reset transistor 53 of the respective pixels and to set the conversion efficiency.

Specifically, in the case where the respective reset transistors 53 of the imaging pixel 31 and the phase difference detection pixel 32 are turned on and the conversion efficiency switching transistor 61 is turned off in the state where the respective transfer transistors 51 of the imaging pixel 31 and the phase difference detection pixel 32 are turned on, the capacity of FD in the pixel sharing unit is the sum of the capacity of the FD 52 of the imaging pixel 31 and the capacity of the FD 52 of the phase difference detection pixel 32.

Moreover, in the case where the reset transistor 53 of any one of the imaging pixel 31 and the phase difference detection pixel 32 is turned on and the conversion efficiency switching transistor 61 is turned off in the state where the respective transfer transistors 51 of the imaging pixel 31 and the phase difference detection pixel 32 are turned on, the capacity of FD in the pixel sharing unit is the sum of the capacity of the FD 52 of the imaging pixel 31, the capacity of the FD 52 of the phase difference detection pixel 32, and the gate capacity and drain capacity of the turned-on reset transistor 53. Accordingly, it is possible to reduce the conversion efficiency as compared with the above-mentioned case.

Furthermore, in the case where the respective reset transistors 53 of the imaging pixel 31 and the phase difference detection pixel 32 are turned on and the conversion efficiency switching transistor 61 is turned off in the state where the respective transfer transistors 51 of the imaging pixel 31 and the phase difference detection pixel 32 are turned on, the capacity of FD in the pixel sharing unit is the sum of the capacity of the FD 52 of the imaging pixel 31, the capacity of the FD 52 of the phase difference detection pixel 32, and the gate capacity and drain capacity of the respective reset transistors 53 of the imaging pixel 31 and the phase difference detection pixel 32. Accordingly, it is possible to further reduce the conversion efficiency as compared with the above-mentioned case.

It should be noted that in the case where the respective reset transistors 53 of the imaging pixel 31 and the phase difference detection pixel 32 are turned on and the conversion efficiency switching transistor 61 is turned on, the charges stored in the FD 52 are reset.

Moreover, in this example, the FD 52 (source of the reset transistor 53) is formed to be surrounded by an element division area isolated by shallow trench isolation (STI).

Figure 11:
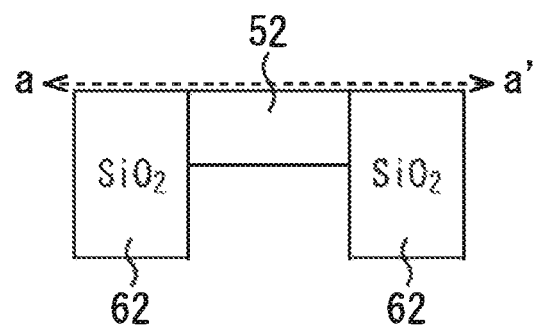
FIG. 11 is a flowchart for explaining the configuration of the FD.

FIG. 11 shows a cross-sectional view of a part of the FD 52 taking along the double headed arrow a-a' of FIG. 10.

As shown in FIG. 11, the FD 52 is formed to be surrounded by element division areas 62 that are isolated by STI and include $SiO_2$, for example. Accordingly, it is possible to suppress the diffusion of the FD 52 by the element division areas 62 and to define the FD line width with the width between the element division areas 62. Therefore, it is possible not only to improve the conversion efficiency by reducing the capacity of the FD 52 but also to reduce the production variability (specifically, variability in the line width and overlapping with respect to a resist in a channel implant process when the FD 52 is formed).

Furthermore, in this example, as shown in FIG. 8, the transfer transistor 51 of each pixel is formed on a corner portion of each photoelectric conversion unit of each pixel, which is formed in a rectangular shape. With such a configuration, the element division area in one pixel cell is reduced, and it is possible to enlarge the area of the photoelectric conversion unit. Therefore, it is possible to advantageously perform designing from a viewpoint of a saturation amount of charge Qs even in the case where the photoelectric conversion unit is divided into two parts in one pixel cell like the phase difference detection pixel 32.

(Configuration Example of Third Embodiment)

Figure 12:
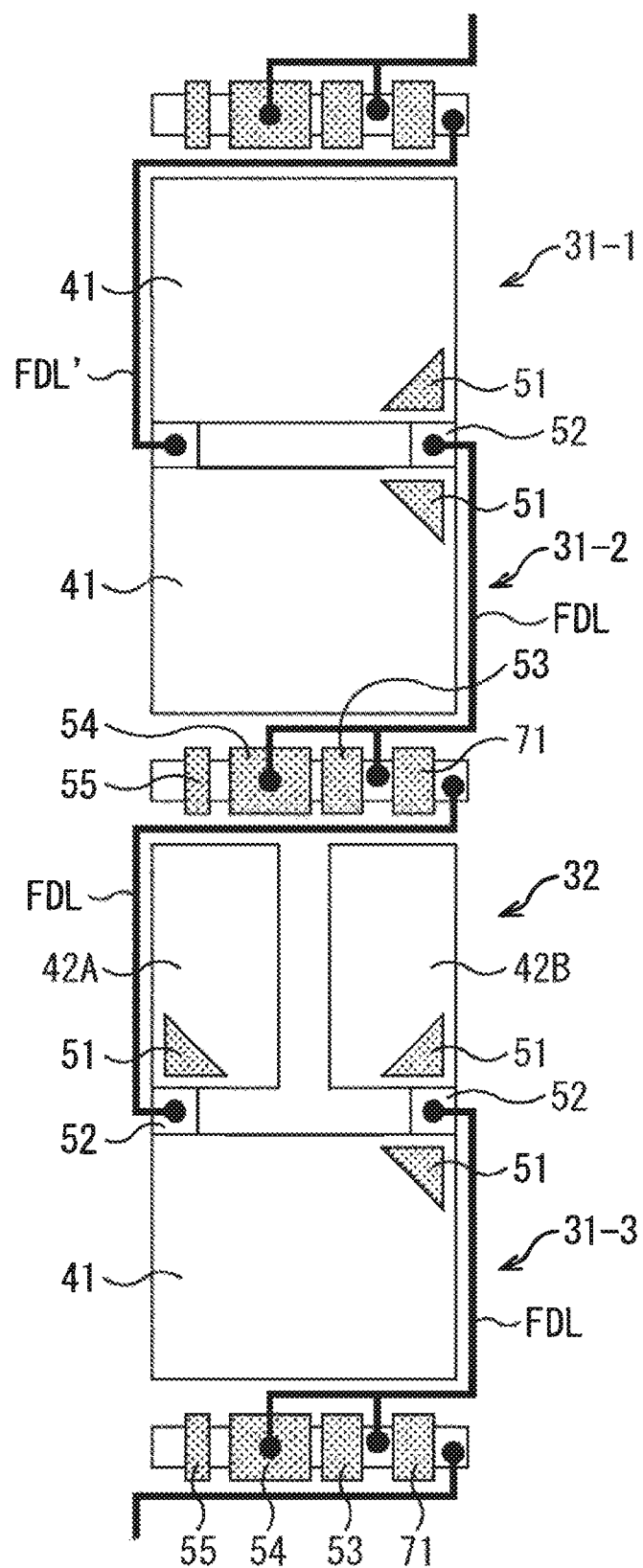
FIG. 12 is a plan view showing a configuration example of a pixel according to a third embodiment of the present disclosure.

Next, a configuration example of an imaging pixel and a phase difference detection pixel according to a third embodiment of the present disclosure will be described with reference to FIGS. 12 and 13. FIG. 12 is a plan view showing a configuration example of the imaging pixel and the phase difference detection pixel, and FIG. 13 is a circuit diagram showing a configuration example of the imaging pixel and the phase difference detection pixel.

Figure 13:
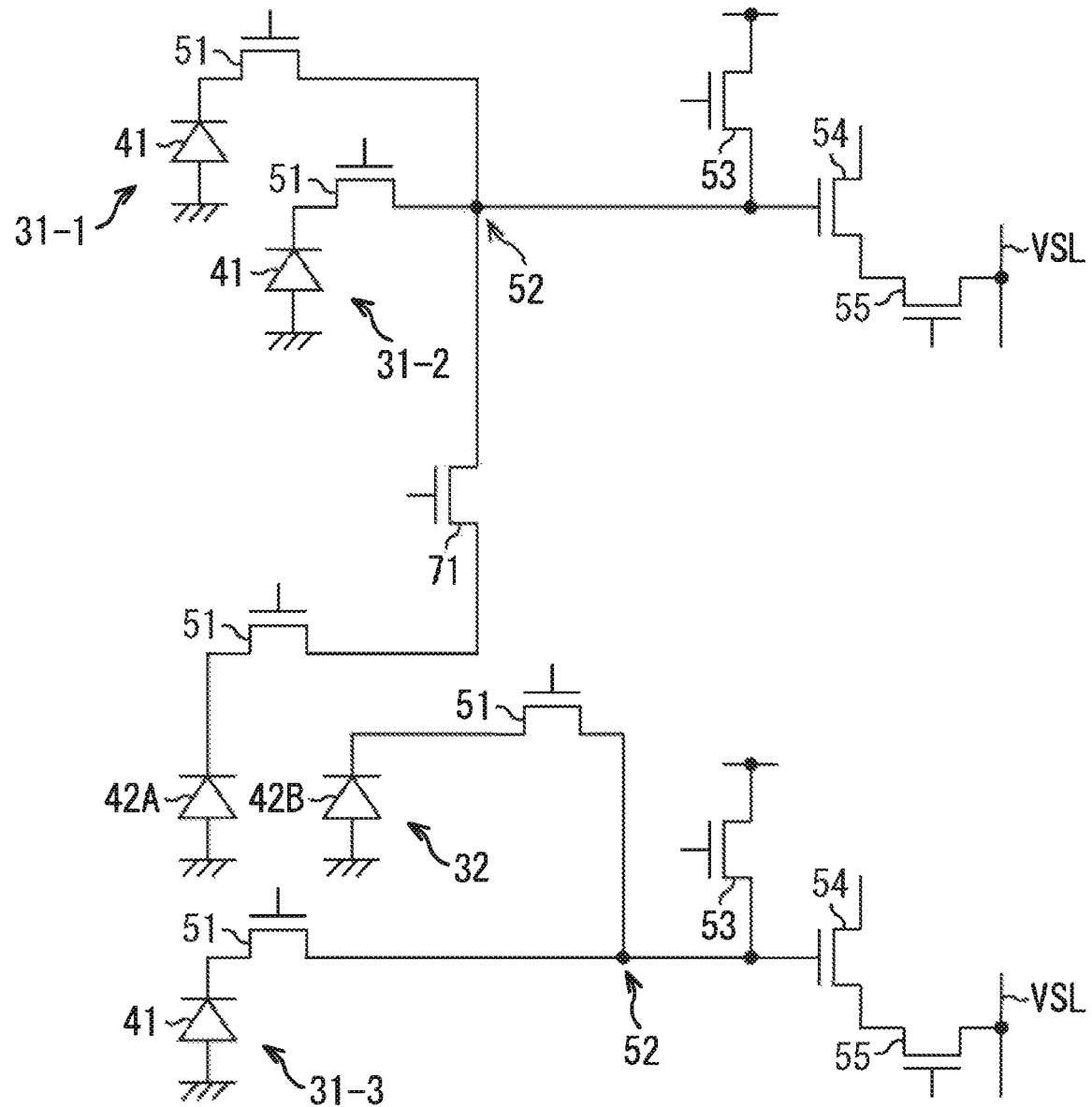
FIG. 13 is a circuit diagram showing another configuration example of the pixel according to the third embodiment of the present disclosure.

In FIGS. 12 and 13, three imaging pixels 31-1 to 31-3 and one phase difference detection pixel 32 are shown.

In this example, the imaging pixel 31-1 and the imaging pixel 31-2 form the configuration in which two vertical pixels are shared, and the phase difference detection pixel 32 and the imaging pixel 31-3 form the configuration in which two vertical pixels are shared. Moreover, each pixel sharing unit is arranged in a row adjacent to each other.

The imaging pixels 31-1 and 31-2 each include the photoelectric conversion unit 41 and the transfer transistor 51, and the photoelectric conversion units 41 share the FD 52, the reset transistor 53, the amplification transistor 54, and the selection transistor 55.

The imaging pixel 31-3 also includes the photoelectric conversion unit 41 and the transfer transistor 51, and the phase difference detection pixel 32 includes the photoelectric conversion units 42A and 42B, and the respective transfer transistors 51 corresponding to the photoelectric conversion units 42A and 42B. Then, the photoelectric conversion unit 41 of the imaging pixel 31-3 and the photoelectric conversion unit 42B of the phase difference detection pixel 32 share the FD 52, the reset transistor 53, the amplification transistor 54, and the selection transistor 55.

Moreover, the transfer transistor 51 corresponding to the photoelectric conversion unit 42A in the phase difference detection pixel 32 is connected to a reading transistor 71 via the adjacent FD 52 and a wiring FDL.

The reading transistor 71 is formed between the FD 52 corresponding to the photoelectric conversion unit 42A and the FD 52 shared by the imaging pixels 31-1 and 31-2. By turning on the reading transistor 71, the photoelectric conversion unit 42A shares the FD 52, the amplification transistor 54, and the selection transistor 55 with the imaging pixels 31-1 and 31-2 (i.e., pixels in adjacent row).

According to the above configuration, because two photoelectric conversion units share an FD and an amplification transistor of different adjacent pixels in the phase difference detection pixel, it is possible to expose and read from the two photoelectric conversion units without providing a charge storage unit and to improve AF speed and accuracy.

It should be noted that in FIG. 12, a wiring FDL' that connects the pixel sharing unit including the imaging pixels 31-1 and 31-2 and a pixel transistor in an adjacent row on the upper side is provided to maintain the symmetry with the wiring FDL that connects the transfer transistor 51 corresponding to the photoelectric conversion unit 42A and a pixel transistor in the pixel sharing unit including the imaging pixels 31-1 and 31-2.

In the above configuration, by turning on the reading transistor 71 when a signal for detecting phase difference is read, a signal corresponding to charges stored in the photoelectric conversion unit 42A is read from a pixel transistor in a pixel sharing unit including the imaging pixels 31-1 and 31-2. A signal corresponding to charges stored in the photoelectric conversion unit 42B is read from a pixel transistor in a pixel sharing unit including the imaging pixel 31-3 and the phase difference detection pixel 32. At this time, by turning on the reading transistor 71 included in the respective pixel transistors, it is possible to make the conversion efficiencies of the signals read from the photoelectric conversion units 42A and 42B equivalent to each other.

On the other hand, by turning off the reading transistor 71 when a signal for capturing an image is read, it is possible to maintain high conversion efficiency of an imaging pixel and to prevent the properties from being deteriorated. Moreover, in the case where the saturation amount of signals is beyond the range of FD, by turning on the reading transistor 71, it is possible to reduce the conversion efficiency and to prevent charges in FD from overflowing. Specifically, in this case, the reading transistor 71 functions as a conversion efficiency switching transistor.

Furthermore, also in this example, as shown in FIG. 12, the transfer transistor 51 of each pixel is formed on a corner portion of the photoelectric conversion unit of each pixel, which is formed in a rectangular shape. With such a configuration, the element division area in one pixel cell is reduced, and it is possible to enlarge the area of the photoelectric conversion unit. Therefore, it is possible to advantageously perform designing from a viewpoint of a saturation amount of charge Qs even in the case where the photoelectric conversion unit is divided into two parts in one pixel cell like the phase difference detection pixel 32.

(Another Configuration Example of Third Embodiment)

Figure 14:
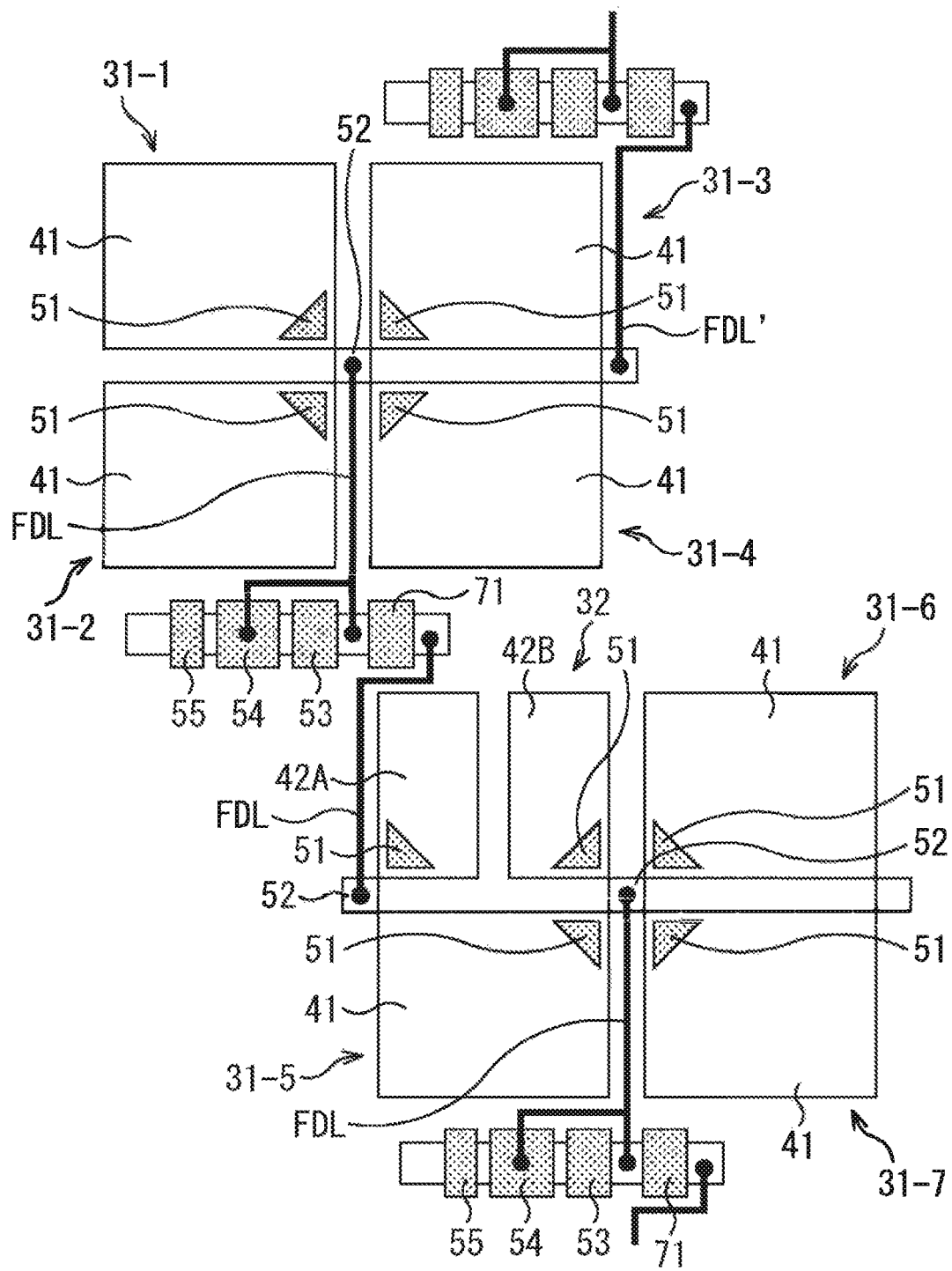
FIG. 14 is a plan view showing another configuration example of the pixel according to the third embodiment of the present disclosure.

Next, another configuration example of an imaging pixel and a phase difference detection pixel according to a third embodiment of the present disclosure will be described with reference to FIGS. 14 and 15. FIG. 14 is a plan view showing a configuration example of the imaging pixel and the phase difference detection pixel, and FIG. 15 is a circuit diagram showing a configuration example of the imaging pixel and the phase difference detection pixel.

Figure 15:
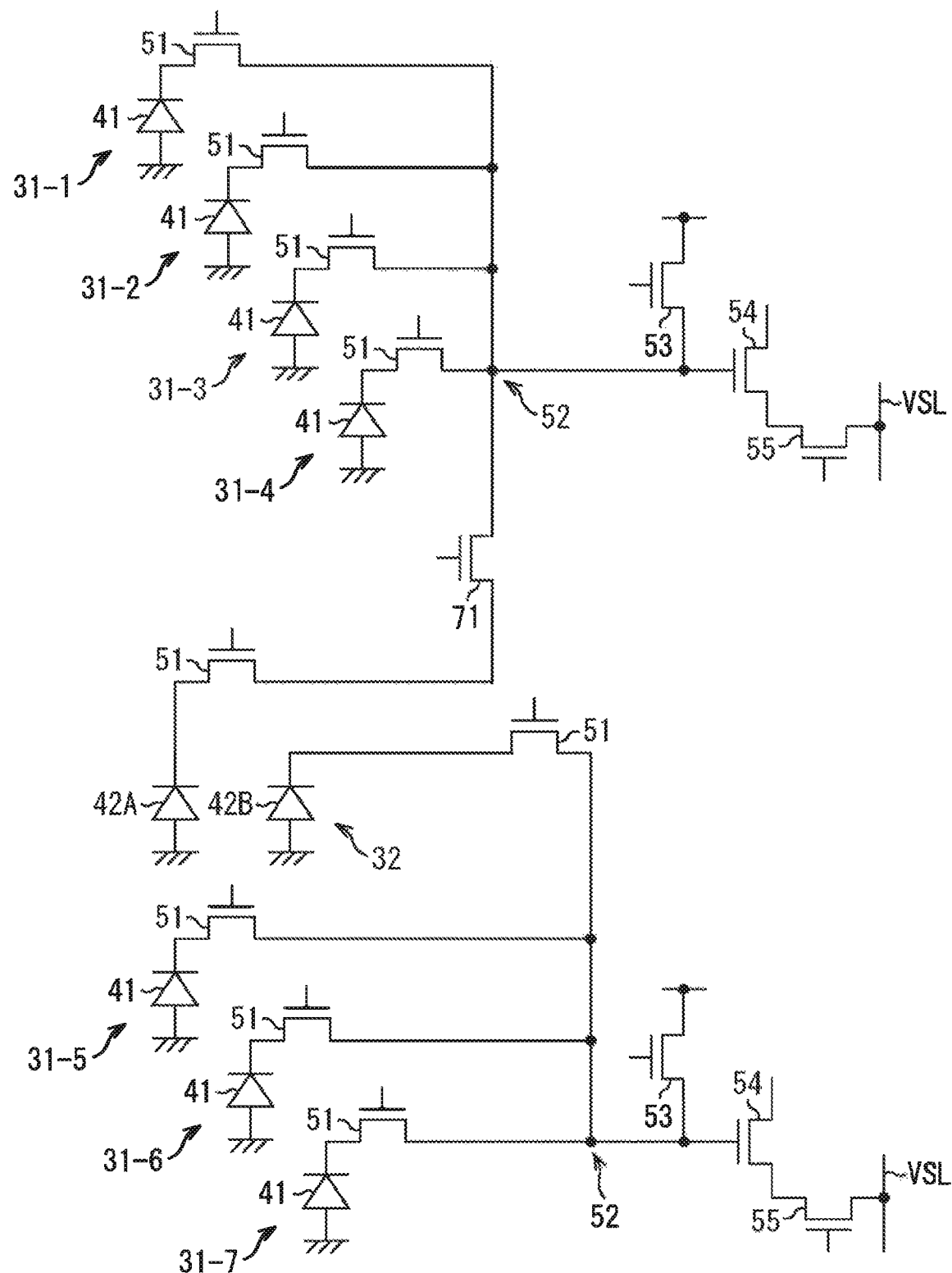
FIG. 15 is a circuit diagram showing another configuration example of the pixel according to the third embodiment of the present disclosure.

In FIGS. 14 and 15, seven imaging pixels 31-1 to 31-7 and one phase difference detection pixel 32 are shown.

In this example, the imaging pixels 31-1 to 31-4, the phase difference detection pixel 32, and the imaging pixels 31-5 to 31-7 form the configuration in which pixels are shared in a 2*2 matrix pattern. Moreover, each pixel sharing unit is arranged in a row adjacent to each other.

The imaging pixels 31-1 to 31-4 each include the photoelectric conversion unit 41 and the transfer transistor 51, and the photoelectric conversion units 41 share the FD 52, the reset transistor 53, the amplification transistor 54, and the selection transistor 55.

The imaging pixels 31-5 to 31-7 also include the photoelectric conversion unit 41 and the transfer transistor 51, and the phase difference detection pixel 32 includes the photoelectric conversion units 42A and 42B and the transfer transistors 51 corresponding to the photoelectric conversion units 42A and 42B. Then, the photoelectric conversion units 41 of the imaging pixels 31-5 to 31-7 share the FD 52, the reset transistor 53, the amplification transistor 54, and the selection transistor 55 with the photoelectric conversion unit 42B of the phase difference detection pixel 32.

Moreover, the transfer transistor 51 corresponding to the photoelectric conversion unit 42A in the phase difference detection pixel 32 is connected to the reading transistor 71 via the adjacent FD 52 and the wiring FDL.

The reading transistor 71 is formed between the FD 52 corresponding to the photoelectric conversion unit 42A and the FD 52 shared by the imaging pixels 31-1 to 31-4. By turning on the reading transistor 71, the photoelectric conversion unit 42A shares the FD 52, the amplification transistor 54, and the selection transistor 55 with the imaging pixels 31-1 to 31-4 (i.e., pixel in an adjacent row).

Also in the above configuration, because two photoelectric conversion units share an FD and an amplification transistor of different adjacent pixels in a phase difference detection pixel, it is possible to expose and read from the two photoelectric conversion units without providing a charge storage unit and to improve AF speed and accuracy.

It should be noted that in FIG. 14, a wiring FDL' that connects the pixel sharing unit including the imaging pixels 31-1 and 31-4 and a pixel transistor in an adjacent row on the upper side is provided to maintain the symmetry with the wiring FDL that connects the transfer transistor 51 corresponding to the photoelectric conversion unit 42A and a pixel transistor in the pixel sharing unit including the imaging pixels 31-1 and 31-4.

It should be noted that although the phase difference detection pixel includes two photoelectric conversion units in the above-mentioned embodiments, the number of photoelectric conversion units is not limited to two, and the phase difference detection pixel may include three or more photoelectric conversion units.

Embodiments of the present disclosure are not limited to the above-mentioned embodiments and various modifications can be made without departing from the gist of the present disclosure.

Furthermore, the present disclosure may also take the following configurations.

(1) A solid-state imaging device, including
a pixel array unit in which a plurality of imaging pixels configured to generate an image, and a plurality of phase difference detection pixels configured to perform phase difference detection are arranged, each of the plurality of phase difference detection pixels including
a plurality of photoelectric conversion units,
a plurality of floating diffusions configured to convert charges stored in the plurality of photoelectric conversion units into voltage, and
a plurality of amplification transistors configured to amplify the converted voltage in the plurality of floating diffusions.

(2) The solid-state imaging device according to (1) above, in which
in each of the plurality of phase difference detection pixels, at least one of the plurality of photoelectric conversion units shares the floating diffusion and the amplification transistor with at least one of the plurality of imaging pixels, which is adjacent to the phase difference detection pixel.

(3) The solid-state imaging device according to (1) or (2) above, in which
the phase difference detection pixel includes a first photoelectric conversion unit and a second photoelectric conversion unit,
the first photoelectric conversion unit shares the floating diffusion and the amplification transistor with a first imaging pixel adjacent to the phase difference detection pixel, and
the second photoelectric conversion unit shares the floating diffusion and the amplification transistor with a second imaging pixel that is different from the first imaging pixel and is adjacent to the phase difference detection pixel.

(4) The solid-state imaging device according to (3) above, in which
the phase difference detection pixel and the first imaging pixel are included in one pixel sharing unit, and
the second imaging pixel is included in another pixel sharing unit.

(5) The solid-state imaging device according to (4) above, in which
a pixel transistor including the amplification transistor is arranged between pixels constituting the pixel sharing unit.

(6) The solid-state imaging device according to (4) or (5) above, in which
the pixel sharing unit includes
a reset transistor configured to discharge charges stored in each of the floating diffusions in the pixels constituting the pixel sharing unit, and
a conversion efficiency switching transistor that is connected to the reset transistor and is configured to change capacity of the floating diffusion in each of the pixels constituting the pixel sharing unit.

(7) The solid-state imaging device according to (6) above, in which
a source of the reset transistor is connected to the floating diffusion in each of the pixels constituting the pixel sharing unit, and
a drain of the reset transistor is connected to a source of the conversion efficiency switching transistor.

(8) The solid-state imaging device according to any one of (4) to (7) above, in which
the floating diffusion is formed surrounded by an element division area isolated by shallow trench isolation.

(9) The solid-state imaging device according to (4) above, in which
the pixel sharing unit including the second imaging pixel is arranged in a row adjacent to the pixel sharing unit including the phase difference detection pixel and the first imaging pixel.

(10) The solid-state imaging device according to (9) above, in which
between the floating diffusion corresponding to the second photoelectric conversion unit and the floating diffusion of the second imaging pixel, a reading transistor configured to read charges stored in the second photoelectric conversion unit is formed.

(11) The solid-state imaging device according to any one of (4) to (10) above, in which
each of the pixels includes a transfer transistor configured to transfer charges stored in the photoelectric conversion unit to the floating diffusion, and
the transfer transistor is formed on a corner portion of the photoelectric conversion unit formed in a rectangular shape.

(12) The solid-state imaging device according to any one of (4) to (11), in which
the pixel sharing unit shares two pixels arranged vertically.

(13) The solid-state imaging device according to (4) to (11) above, in which
the pixel sharing unit shares pixels arranged in a 2*2 matrix pattern.

(14) A method for driving a solid-state imaging device that includes a pixel array unit in which a plurality of imaging pixels configured to generate an image, and a plurality of phase difference detection pixels configured to perform phase difference detection are arranged, each of the plurality of phase difference detection pixels including a plurality of photoelectric conversion units, a plurality of floating diffusions configured to convert charges stored in the plurality of photoelectric conversion units into voltage, and a plurality of amplification transistors configured to amplify the converted voltage in the plurality of floating diffusions, the method including:

storing charges in the plurality of photoelectric conversion units; and reading signals corresponding to the charges stored in the plurality of photoelectric conversion units, by the solid-state imaging device, in the phase difference detection pixel.

(15) An electronic apparatus, including a solid-state imaging device that includes a pixel array unit in which a plurality of imaging pixels configured to generate an image, and a plurality of phase difference detection pixels configured to perform phase difference detection are arranged, each of the plurality of phase difference detection pixels including a plurality of photoelectric conversion units, a plurality of floating diffusions configured to convert charges stored in the plurality of photoelectric conversion units into voltage, and a plurality of amplification transistors configured to amplify the converted voltage in the plurality of floating diffusions.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging device, comprising:
a pixel array unit including a first pixel, a second pixel, a third pixel, and a fourth pixel; and
a first floating diffusion, a second floating diffusion, and a third floating diffusion disposed in a semiconductor substrate,
wherein the first pixel includes a first transfer transistor, the second pixel includes a second transfer transistor, and the third pixel includes a third transfer transistor,
wherein the fourth pixel includes a fourth transfer transistor and a fifth transfer transistor,
wherein the first and second transfer transistors are coupled to the first floating diffusion,
wherein the third and fourth transfer transistors are coupled to the second floating diffusion,
wherein the fifth transistor is coupled to the third floating diffusion,
wherein the second floating diffusion is disposed between the third transfer transistor and the fourth transfer transistor in a plan view,
wherein the first floating diffusion is coupled to a first amplification transistor,
wherein the second floating diffusion is coupled to a second amplification transistor, and
wherein the third floating diffusion is coupled to the first amplification transistor via a reading transistor.

2. The imaging device according to claim 1, wherein the first, second, and third pixels comprise imaging pixels, and wherein the fourth pixel comprises a phase difference detection pixel.

3. The imaging device according to claim 2, wherein the first imaging pixel and the second imaging pixel form a first pixel sharing unit, and wherein the first pixel sharing unit shares two pixels arranged vertically.

4. The imaging device according to claim 3, wherein the first pixel sharing unit shares a first reset transistor, the first amplification transistor, and a first selection transistor.

5. The imaging device according to claim 2, wherein the third imaging pixel and the phase difference detection pixel form a second pixel sharing unit, and wherein the second pixel sharing unit shares two pixels arranged vertically.

6. The imaging device according to claim 5, wherein the second pixel sharing unit shares a second reset transistor, the second amplification transistor, and a second selection transistor.

7. The imaging device according to claim 1, wherein the first pixel includes a first photoelectric conversion unit, wherein the second pixel includes a second photoelectric conversion unit, and wherein the first and second photoelectric conversion units share the first floating diffusion.

8. The imaging device according to claim 1, wherein the third pixel includes a third photoelectric conversion unit, wherein the fourth pixel includes a fourth photoelectric conversion unit and a fifth photoelectric conversion unit, and wherein the third and fifth photoelectric conversion units share the second floating diffusion.

9. The imaging device according to claim 8, wherein the first, second, third, fourth, and fifth transfer transistors are each formed in a corner portion of their respective photoelectric conversion unit in each pixel.

10. The imaging device according to claim 9, wherein each photoelectric conversion unit in each pixel is formed in a rectangular shape.

11. A method for driving an imaging device, the imaging device including:
a pixel array unit including a first pixel, a second pixel, a third pixel, and a fourth pixel; and
a first floating diffusion, a second floating diffusion, and a third floating diffusion disposed in a semiconductor substrate,
wherein the first pixel includes a first transfer transistor, the second pixel includes a second transfer transistor, and the third pixel includes a third transfer transistor,
wherein the fourth pixel includes a fourth transfer transistor and a fifth transfer transistor,
wherein each of the first and second transfer transistors is coupled to the first floating diffusion,
wherein each of the third and fourth transfer transistors is coupled to the second floating diffusion,
wherein the fifth transistor is coupled to the third floating diffusion,
wherein the second floating diffusion is disposed between the third transfer transistor and the fourth transfer transistor in a plan view,
wherein the first floating diffusion is coupled to a first amplification transistor,
wherein the second floating diffusion is coupled to a second amplification transistor, and
wherein the third floating diffusion is coupled to the first amplification transistor via a reading transistor.

12. An electronic apparatus, comprising:
an imaging device that includes:
a pixel array unit including a first pixel, a second pixel, a third pixel, and a fourth pixel; and
a first floating diffusion, a second floating diffusion, and a third floating diffusion disposed in a semiconductor substrate, wherein the first pixel includes a first transfer transistor, the second pixel includes a second transfer transistor, and the third pixel includes a third transfer transistor, wherein the fourth pixel includes a fourth transfer transistor and a fifth transfer transistor, wherein each of the first and second transfer transistors is coupled to the first floating diffusion, wherein each of the third and fourth transfer transistors is coupled to the second floating diffusion, wherein the fifth transistor is coupled to the third floating diffusion, wherein the second floating diffusion is disposed between the third transfer transistor and the fourth transfer transistor in a plan view, wherein the first floating diffusion is coupled to a first amplification transistor, wherein the second floating diffusion is coupled to a second amplification transistor, and wherein the third floating diffusion is coupled to the first amplification transistor via a reading transistor.

13. The imaging device according to claim 1, further comprising:

the reading transistor disposed between the first floating diffusion and the third floating diffusion.

14. The imaging device according to claim 1, wherein the first floating diffusion is disposed between the first transfer transistor and the third transfer transistor.

15. The imaging device according to claim 1, wherein the first transfer transistor, the first floating diffusion, the second transfer transistor, and the third floating diffusion are in this order in a direction from the first pixel to the third pixel.

16. The method according to claim 11, wherein the imaging device further comprises:

the reading transistor disposed between the first floating diffusion and the third floating diffusion.

17. The method according to claim 11, wherein the first floating diffusion is disposed between the first transfer transistor and the third transfer transistor.

18. The method according to claim 11, wherein the first transfer transistor, the first floating diffusion, the second transfer transistor, and the third floating diffusion are in this order in a direction from the first pixel to the third pixel.

19. The electronic apparatus according to claim 12, wherein the imaging device further comprises:

the reading transistor disposed between the first floating diffusion and the third floating diffusion.

20. The electronic apparatus according to claim 12, wherein the first floating diffusion is disposed between the first transfer transistor and the third transfer transistor.

* * * * *